United States Patent
Hirase et al.

(10) Patent No.: US 10,673,017 B2
(45) Date of Patent: Jun. 2, 2020

(54) ORGANIC EL DISPLAY DEVICE

(71) Applicant: Sharp Kabushiki Kaisha, Sakai, Osaka (JP)

(72) Inventors: Takeshi Hirase, Sakai (JP); Tohru Sonoda, Sakai (JP); Takashi Ochi, Sakai (JP); Hisao Ochi, Sakai (JP); Tohru Senoo, Sakai (JP); Akihiro Matsui, Sakai (JP); Jumpei Takahashi, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 164 days.

(21) Appl. No.: 16/066,349

(22) PCT Filed: Mar. 23, 2017

(86) PCT No.: PCT/JP2017/011568
§ 371 (c)(1),
(2) Date: Jun. 27, 2018

(87) PCT Pub. No.: WO2018/173177
PCT Pub. Date: Sep. 27, 2018

(65) Prior Publication Data
US 2019/0363289 A1 Nov. 28, 2019

(51) Int. Cl.
*H01L 51/52* (2006.01)
*H01L 51/56* (2006.01)
*H01L 27/32* (2006.01)

(52) U.S. Cl.
CPC ...... *H01L 51/5253* (2013.01); *H01L 27/3276* (2013.01); *H01L 51/56* (2013.01)

(58) Field of Classification Search
CPC .. H01L 51/5253; H01L 51/56; H01L 27/3276
See application file for complete search history.

(56) References Cited

U.S. PATENT DOCUMENTS

| 2012/0256201 A1 | 10/2012 | Lee et al. |
| 2013/0307753 A1 | 11/2013 | Andrenko |

(Continued)

FOREIGN PATENT DOCUMENTS

| JP | 2006-31333 A | 2/2006 |
| JP | 2008-71608 A | 3/2008 |

(Continued)

OTHER PUBLICATIONS

Official Communication issued in International Patent Application No. PCT/JP2017/011568, dated Jun. 27, 2017.

*Primary Examiner* — Mark W Tornow
(74) *Attorney, Agent, or Firm* — Keating & Bennett, LLP (57) ABSTRACT

An organic EL display device includes an organic EL element and a sealing film. The organic EL element is formed over a display region of a base substrate. The sealing film covers the organic EL element. The sealing film includes a first barrier layer, a buffer layer, and a second barrier layer. The first barrier layer includes a first inorganic film and is disposed on the surface of the organic EL element. The buffer layer includes an organic film and is disposed on the surface of the first barrier layer. The second barrier layer includes a second inorganic film and is disposed on the surface of the buffer layer. The first barrier layer includes micropores in the surface, the surface being in contact with the buffer layer.

19 Claims, 8 Drawing Sheets

(56) References Cited

U.S. PATENT DOCUMENTS

| | | | |
|---|---|---|---|
| 2015/0021565 A1 | 1/2015 | Min et al. | |
| 2015/0249228 A1* | 9/2015 | Inoue ................. | H01L 51/5203 |
| | | | 428/216 |
| 2015/0357598 A1* | 12/2015 | Osaki ................. | H01L 51/5212 |
| | | | 257/40 |
| 2017/0018737 A1* | 1/2017 | Kim .................... | H01L 51/5256 |
| 2017/0069876 A1* | 3/2017 | Popp .................. | H01L 51/5256 |
| 2017/0092896 A1* | 3/2017 | Nakamura .......... | H01L 51/5256 |
| 2018/0047940 A1 | 2/2018 | Sonoda et al. | |

FOREIGN PATENT DOCUMENTS

| | | |
|---|---|---|
| JP | 2014-507819 A | 3/2014 |
| JP | 2015-23023 A | 2/2015 |
| WO | 2016/140130 A1 | 9/2016 |

\* cited by examiner

ORGANIC EL DISPLAY DEVICE

TECHNICAL FIELD

The disclosure relates to an organic EL display device and a method for producing the same.

BACKGROUND ART

In recent years, organic EL display devices, which use organic electroluminescence (EL) elements and are of the self-luminous type, have attracted attention as a display device that can replace the liquid crystal display device. For the organic EL display device, a seal structure is proposed to inhibit degradation of the organic EL element due to penetration of, for example, moisture and oxygen. The seal structure includes a sealing film covering the organic EL element, and the sealing film includes a stack of an inorganic film and an organic film.

For example, one disclosed organic EL display device includes an inorganic film, which is a constituent of the sealing film, formed by a Chemical Vapor Deposition (CVD) method and an organic film stacked thereafter on the surface of the inorganic film by an ink-jet method (see, for example, PTL 1).

Another disclosed organic EL display device, for example, includes a sealing film including an inorganic film and an organic film, which are constituents of the sealing film, formed by, for example, a vapor deposition method (see, for example, PTL 2).

CITATION LIST

Patent Literature

PTL 1: JP 2014-507819 A
PTL 2: JP 2006-31333 A

SUMMARY

Technical Problem

In the organic EL display device disclosed in PTL 1, the inorganic film, which is a constituent of the sealing film, is formed by a Chemical Vapor Deposition (CVD) method, and thus the inorganic film has a very smooth surface. As a result, in the sealing film, the adhesion between the inorganic film and the organic film formed on the surface of the inorganic film is low, and consequently, a problem arises in that the organic film may delaminate.

Also, for the organic EL display device disclosed in PTL 2, a mask is used for vapor deposition, and thus, in a subsequent step, the mask needs to be removed from the substrate. Thus, a problem arises in that, in the removal step, adhesion of, for example, foreign matter (particles) may occur and this decreases the sealing performance.

The disclosure has been made in view of the above-described problems. An object of the disclosure is to provide an organic EL display device in which a sealing film is formed with improved adhesion between an inorganic film and an organic film to prevent delamination of the organic film, and to provide a method for producing such an organic EL display device.

Solution to Problem

To achieve the object described above, a display device according to the disclosure is provided. The display device includes a base substrate, a light emitting element, and a sealing film. The base substrate is flexible and includes a display region and a non-display region each defined on the base substrate. The non-display region is disposed around the display region. The display device is configured to display images over the display region. The light emitting element is disposed over the display region of the base substrate. The sealing film is disposed over the display region and the non-display region, and covers the light emitting element. The sealing film includes a first barrier layer, a buffer layer, and a second barrier layer. The first barrier layer includes a first inorganic film. The buffer layer includes an organic film and is disposed on a surface of the first barrier layer. The second barrier layer includes a second inorganic film and is disposed on a surface of the buffer layer. A plurality of micropores are formed in the surface of the first barrier layer, the surface being in contact with the buffer layer.

Furthermore, according to the disclosure, a method for producing a display device is provided. The display device includes a base substrate, a light emitting element, and a sealing film. The base substrate is flexible and includes a display region and a non-display region each defined on the base substrate. The non-display region is disposed around the display region. The display device is configured to display images over the display region. The light emitting element is disposed over the display region of the base substrate. The sealing film is disposed over the display region and the non-display region, and covers the light emitting element. The sealing film includes a first barrier layer, a buffer layer, and a second barrier layer. The first barrier layer includes a first inorganic film. The buffer layer includes an organic film and is disposed on a surface of the first barrier layer. The second barrier layer includes a second inorganic film and is disposed on a surface of the buffer layer. The method includes forming the first barrier layer, forming a plurality of micropores, and forming the buffer layer. The first barrier layer is formed to cover the light emitting element disposed over the base substrate. The plurality of micropores are formed in the surface of the first barrier layer by plasma treatment. The buffer layer is formed on the surface of the first barrier layer, the surface including the plurality of micropores.

Advantageous Effects of Disclosure

In the disclosure, the plurality of micropores formed in the first barrier layer produce an anchoring effect. As a result, the adhesion between the first barrier layer and the buffer layer is improved and thus delamination of the buffer layer is prevented. Consequently, an organic EL display device having excellent sealing performance is provided.

DESCRIPTION OF EMBODIMENTS

Embodiments of the disclosure will be described below in detail with reference to the drawings. The disclosure is not limited to the embodiments described below.

First Embodiment

Figure 1:
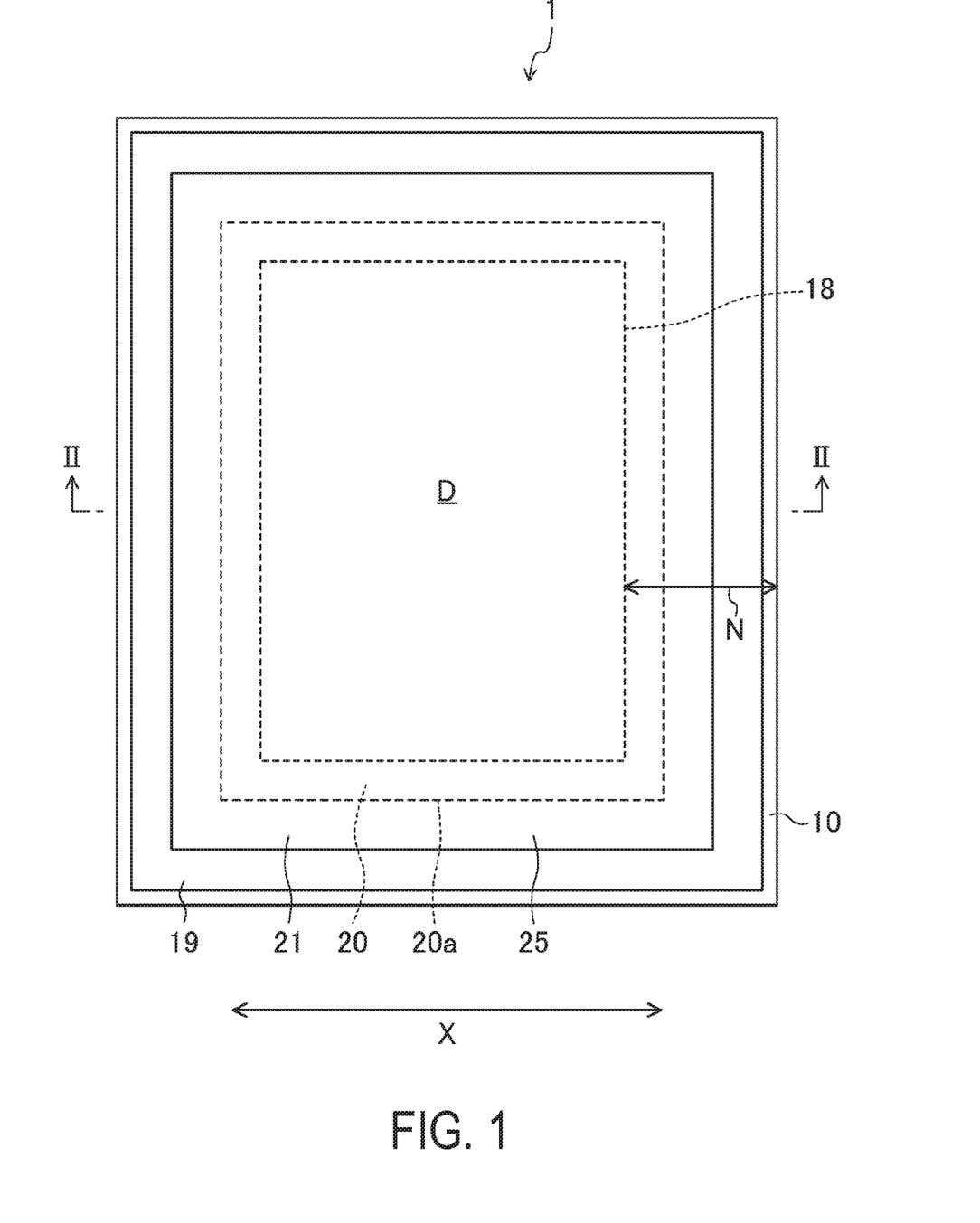
FIG. 1 is a plan view of an organic EL display device according to a first embodiment of the disclosure, schematically illustrating a configuration of the device.
Figure 2:
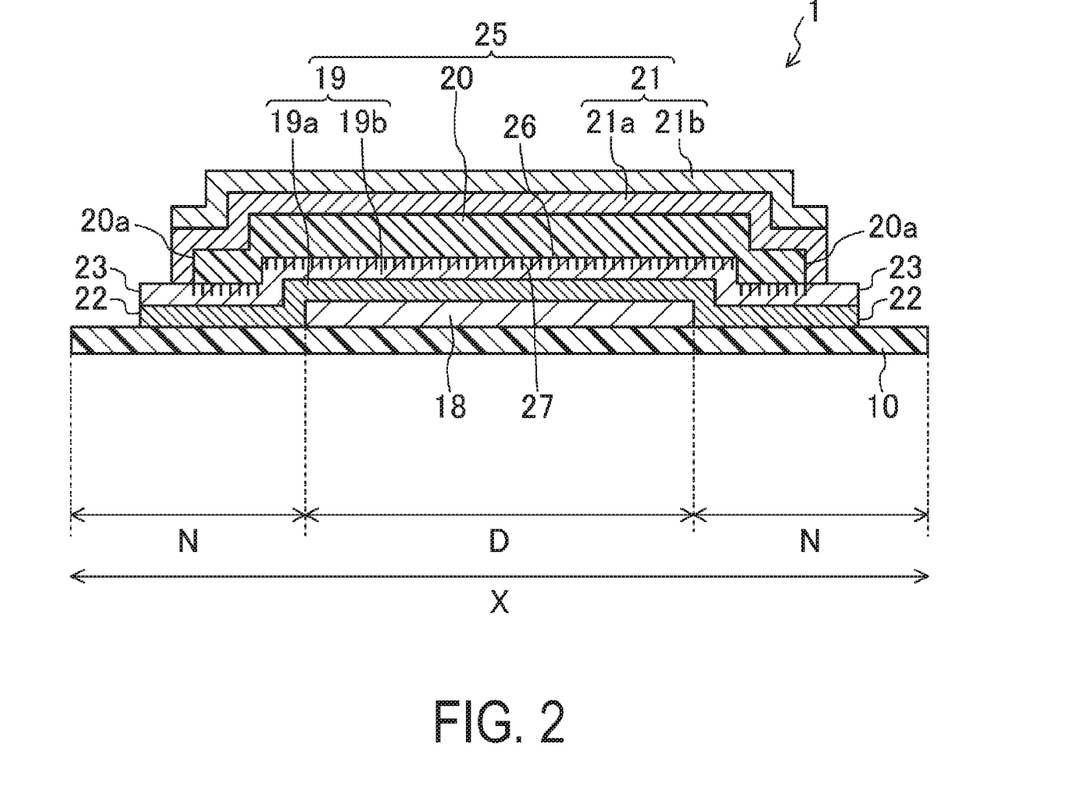
FIG. 2 is a cross-sectional view of the organic EL display device taken along line II-II of FIG. 1, schematically illustrating the configuration of the device.
Figure 3:
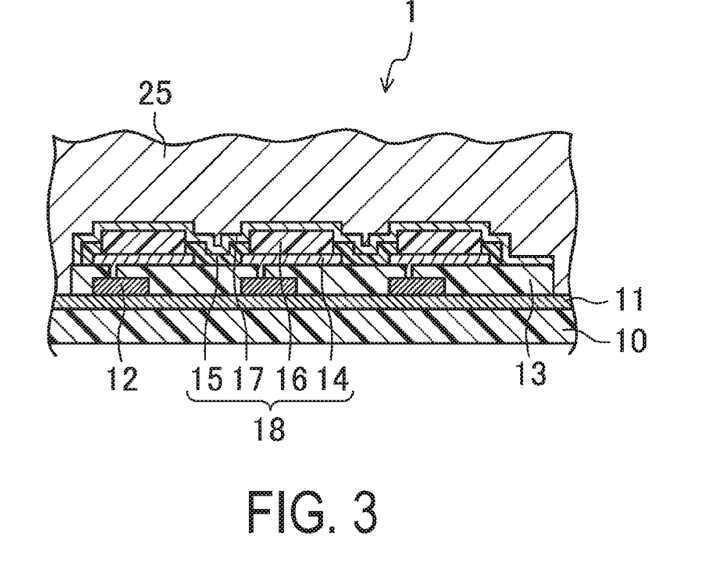
FIG. 3 is a cross-sectional view of the organic EL display device according to the first embodiment of the disclosure, illustrating an internal structure of the device.
Figure 4:
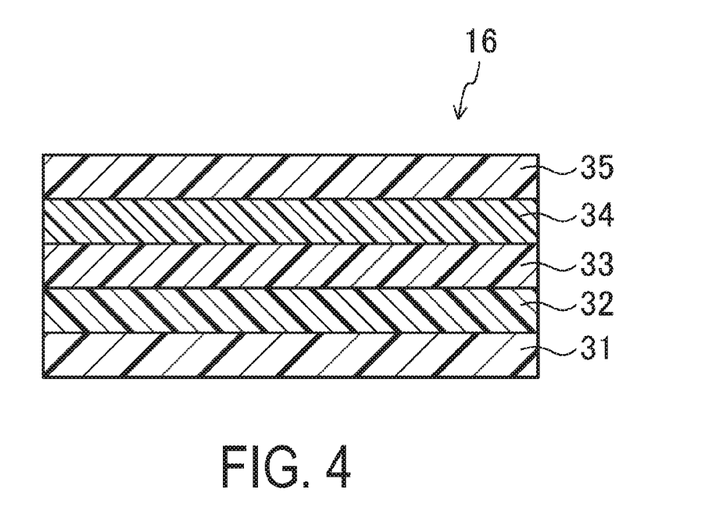
FIG. 4 is a cross-sectional view of an organic EL layer included in the organic EL display device according to the first embodiment of the disclosure.

FIG. 1 is a plan view of an organic EL display device according to the present embodiment, schematically illustrating a configuration of the device. FIG. 2 is a cross-sectional view of the organic EL display device taken along line II-II of FIG. 1, schematically illustrating the configuration of the device. FIG. 3 is a cross-sectional view of the organic EL display device, illustrating an internal structure of the device. FIG. 4 is a cross-sectional view of an organic EL layer included in the organic EL display device.

As illustrated in FIGS. 1 and 2, the organic EL display device 1 includes a base substrate 10, an organic EL element 18, and a sealing film 25. The base substrate 10 is provided as a base substrate and transparent. The organic EL element 18 is disposed on (indirectly on) the base substrate 10. The sealing film 25 is disposed to cover the organic EL element 18.

As illustrated in FIG. 1, in the organic EL display device 1, the organic EL element 18 is disposed in a rectangular shape in plan view. Thus, a display region D is defined in a rectangular shape, for displaying images. In the display region D, a plurality of pixels are arranged in a matrix form. Each of the pixels includes a sub pixel for display of red gradation, a sub pixel for display of green gradation, and a sub pixel for display of blue gradation. These sub pixels are disposed adjacent to one another.

As illustrated in FIG. 1, the organic EL display device 1 includes a frame region (non-display region) N. The frame region N is defined around the display region D and has a frame shape. As illustrated in FIG. 3, the organic EL display device 1 includes, between the base substrate 10 and the organic EL element 18, a base coating film 11, a plurality of TFTs 12, and an interlayer insulating film 13, which are arranged in the order stated, with the base coating film 11 being closest to the base substrate 10.

The base substrate 10 is a plastic substrate including a polyimide resin, for example. In the present embodiment, the illustrated example of the base substrate is a flexible and insulating transparent resin substrate, but the base substrate may be an insulating transparent glass substrate or an electrically conductive opaque metal sheet, for example.

As illustrated in FIG. 3, the base coating film 11 is disposed over the base substrate 10. The base coating film 11 includes an inorganic film, such as a silicon oxide film or a silicon nitride film, for example.

As illustrated in FIG. 3, the TFT 12 is a switching element provided for each of the sub pixels and disposed over the base coating film 11. The TFTs 12 each include, for example, a gate electrode, a gate insulator film, a semiconductor layer, and source and drain electrodes. The gate electrode is disposed over the base coating film 11. The gate insulator film is disposed to cover the gate electrode. The semiconductor layer is disposed over the gate insulator film and overlap the gate electrode. The source and drain electrodes are disposed over the semiconductor layer and face each other. In the present embodiment, the bottom-gate type is described as an example of the TFT 12, but the TFT 12 may be of the top-gate type.

As illustrated in FIG. 3, the interlayer insulating film 13 is disposed to cover the TFTs 12 except for a portion of each of the drain electrodes. The interlayer insulating film 13 includes, for example, a transparent organic resin material, such as an acrylic resin.

The organic EL element 18 is disposed over the display region D. As illustrated in FIG. 3, the organic EL element 18 includes first electrodes 14, edge covers 15, organic EL layers 16, and a second electrode 17, which are arranged in the order stated over the interlayer insulating film 13.

As illustrated in FIG. 3, the plurality of first electrodes 14 are arranged in a matrix form over the interlayer insulating film 13, and correspond to the respective sub pixels. As illustrated in FIG. 3, the first electrodes 14 are connected to the respective drain electrodes of the TFTs 12 via respective contact holes formed in the interlayer insulating film 13. The first electrode 14 functions to inject holes into the organic EL layer 16. It is more preferable that the first electrodes 14 include a material having a large work function to improve the efficiency of hole injection into the organic EL layer 16. Examples of materials that may be included in the first electrode 14 include metal materials, such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). Further examples of materials that may be included in the first electrode 14 include alloys, examples of which include magnesium (Mg)-copper (Cu), magnesium (Mg)-silver (Ag), sodium (Na)-potassium (K), astatine (At)-astatine oxide ($AtO_2$), lithium (Li)-aluminum (Al), lithium (Li)-calcium (Ca)-aluminum (Al), and lithium fluoride (LiF)-calcium (Ca)-aluminum (Al). Further examples of materials that may be included in the first electrode 14 include electrically conductive oxides, examples of which include tin oxide (SnO), zinc oxide (ZnO), indium tin oxide (ITO), and indium zinc oxide (IZO). The first electrode 14 may include a stack of two or more layers of any of the above-mentioned materials. Examples of materials having a large work function include indium tin oxide (ITO) and indium zinc oxide (IZO).

As illustrated in FIG. 3, the edge cover 15 is disposed in a lattice form and surrounds the outer perimeter portion of the first electrodes 14. The edge cover 15 may be, for example, an inorganic film or an organic film. Examples of materials that may be included in the inorganic film include silicon oxide (SiO$_2$), silicon nitride (SiNx (x is a positive number)) such as trisilicon tetranitride (Si$_3$N$_4$), and silicon oxynitride (SiON). Examples of materials that may be included in the organic film include polyimide resins, acrylic resins, polysiloxane resins, and novolak resins.

As illustrated in FIG. 3, the plurality of organic EL layers 16 are arranged in a matrix form on the respective first electrodes 14, and correspond to the respective sub pixels. As illustrated in FIG. 4, the organic EL layers 16 each include a hole injecting layer 31, a hole transport layer 32, a light emitting layer 33, an electron transport layer 34, and an electron injecting layer 35, which are arranged in the order stated over the first electrode 14.

The hole injecting layer 31 is also referred to as an anode buffer layer, and functions to reduce the energy level difference between the first electrode 14 and the organic EL layer 16, to improve the efficiency of hole injection into the organic EL layer 16 from the first electrode 14. Examples of materials that may be included in the hole injecting layer 31 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer 32 functions to improve the efficiency of hole transport from the first electrode 14 to the organic EL layer 16. Examples of materials that may be included in the hole transport layer 32 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light emitting layer 33 is a region where the holes and the electrons recombine, when a voltage is applied via the first electrode 14 and the second electrode 17, holes and electrons are injected from the first electrode 14 and the second electrode 17, respectively. The light emitting layer 33 includes a material having a high light emitting efficiency. Examples of materials that may be included in the light emitting layer 33 include metal oxinoid compounds (8-hydroxyquinoline metal complexes), naphthalene derivatives, anthracene derivatives, diphenyl ethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, and polysilane.

The electron transport layer 34 functions to facilitate migration of the electrons to the light emitting layer 33 efficiently. Examples of materials that may be included in the electron transport layer 34 include organic compounds, example of which include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, and metal oxinoid compounds.

The electron injecting layer 35 functions to reduce the energy level difference between the second electrode 17 and the organic EL layer 16, to improve the efficiency of electron injection into the organic EL layer 16 from the second electrode 17. Because of this function, the driving voltage for the organic EL element 18 can be reduced. The electron injecting layer 35 is also referred to as a cathode buffer layer. Examples of materials that may be included in the electron injecting layer 35 include inorganic alkaline compounds, such as lithium fluoride (LiF), magnesium fluoride (MgF$_2$), calcium fluoride (CaF$_2$), strontium fluoride (SrF$_2$), and barium fluoride (BaF$_2$); aluminum oxide (Al$_2$O$_3$), and strontium oxide (SrO).

As illustrated in FIG. 3, the second electrode 17 is disposed to cover the organic EL layers 16 and the edge covers 15. The second electrode 17 functions to inject electrons into the organic EL layer 16. It is more preferable that the second electrode 17 includes a material having a small work function to improve the efficiency of electron injection into the organic EL layer 16.

Examples of materials that may be included in the second electrode 17 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). Further examples of materials that may be included in the second electrode 17 include alloys, examples of which include magnesium (Mg)-copper (Cu), magnesium (Mg)-silver (Ag), sodium (Na)-potassium (K), astatine (At)-astatine oxide (AtO$_2$), lithium (Li)-aluminum (Al), lithium (Li)-calcium (Ca)-aluminum (Al), and lithium fluoride (LiF)-calcium (Ca)-aluminum (Al). Further examples of materials that may be included in the second electrode 17 include electrically conductive oxides, examples of which include tin oxide (SnO), zinc oxide (ZnO), indium tin oxide (ITO), and indium zinc oxide (IZO). The second electrode 17 may include a stack of two or more layers of any of the above-mentioned materials. Examples of materials having a small work function include magnesium (Mg), lithium (Li), lithium fluoride (LiF), magnesium (Mg)-copper (Cu), magnesium (Mg)-silver (Ag), sodium (Na)-potassium (K), lithium (Li)-aluminum (Al), lithium (Li)-calcium (Ca)-aluminum (Al), and lithium fluoride (LiF)-calcium (Ca)-aluminum (Al).

The sealing film 25 is disposed over the display region D and the non-display region N, and covers the organic EL element 18. The sealing film 25 functions to protect the organic EL element 18 from moisture and oxygen. As illustrated in FIG. 2, the sealing film 25 includes a first barrier layer 19, a buffer layer 20, and a second barrier layer 21, which are arranged in the order stated, with the first barrier layer 19 being closest to the organic EL element 18.

More specifically, the sealing film 25 is disposed on the surface of the organic EL element 18, and includes the first barrier layer 19, the buffer layer 20, and the second barrier layer 21. The first barrier layer 19 includes a first inorganic film. The buffer layer 20 includes an organic film and is disposed on the surface of the first barrier layer 19. The second barrier layer 21 includes a second inorganic film and is disposed on the surface of the buffer layer 20.

As illustrated in FIG. 2, the first barrier layer 19 includes a silicon nitride (SiN) layer 19a and a silicon oxynitride (SiON) layer 19b. The silicon nitride layer 19a is disposed on the surface of the organic EL element 18. The silicon oxynitride layer 19b is disposed on the surface of the silicon nitride layer 19a and is in contact with the buffer layer 20.

As illustrated in FIG. 2, the second barrier layer 21 includes a silicon nitride (SiN) layer 21a and a silicon oxynitride (SiON) layer 21b. The silicon nitride layer 21a is disposed on the surface of the buffer layer 20. The silicon oxynitride layer 21b is disposed on the surface of the silicon nitride layer 21a.

The silicon nitride layer 19a and the silicon oxynitride layer 19b are stacked in such a manner that edge surfaces 22 of the silicon nitride layer 19a are flush with edge surfaces 23 of the silicon oxynitride layer 19b in a width direction X of the organic EL display device 1.

The buffer layer 20 includes an organic film including, for example, acrylate, polyurea, parylene, polyimide, or polyamide. As illustrated in FIG. 2, the buffer layer 20 is covered by the second barrier layer 21.

The organic EL display device 1, configured as described above, is flexible. In each of the sub pixels, the light emitting layer 33 of the organic EL layer 16 is configured to emit light via the TFT 12 appropriately so that images can be displayed.

As illustrated in FIG. 2, in the organic EL display device 1, a plurality of micropores 27 are formed in a surface 26 of the silicon oxynitride layer 19b. The surface 26 is in contact with the buffer layer 20. The micropores 27 produce an anchoring effect, and thus, the buffer layer 20 can be formed on the surface of the first barrier layer 19 with improved adhesion between the first barrier layer 19 and the buffer layer 20.

Next, a method for producing the organic EL display device according to the present embodiment will be described. FIGS. 5 to 8 are cross-sectional views illustrating a method for producing the organic EL display device according to the present embodiment.

The organic EL display device 1 according to the present embodiment can be produced in the following manner, for example. First, as illustrated in FIG. 3, the base coating film 11 is formed on the surface of the base substrate 10, which includes a polyimide resin. Thereafter, the plurality of TFTs 12 for driving the organic EL element 18 are formed on the base coating film 11 at a predetermined interval. Next, a photosensitive acrylic resin is applied to the base coating film 11, on which the TFTs 12 are disposed, by spin coating. The applied photosensitive acrylic resin is exposed to a predetermined amount of light through a photomask having a predetermined exposure pattern, and then is subjected to development with an alkaline developer. In this manner, the interlayer insulating film 13 is formed over the base coating film 11 to cover the TFTs 12, as illustrated in FIG. 3. In the process, contact holes (e.g., 5 μm in diameter) for electrically connecting the first electrodes 14 to the TFTs 12 are formed in the interlayer insulating film 13.

Next, as illustrated in FIG. 3, the organic EL element 18 (first electrodes 14, edge covers 15, organic EL layers 16 (hole injecting layers 31, hole transport layers 32, light emitting layers 33, electron transport layers 34, electron injecting layers 35), second electrode 17) are formed on the surface of the interlayer insulating film 13 by using a known method.

Next, the inorganic films and the organic film are formed by, for example, a Chemical Vapor Deposition (CVD) method or a vapor deposition method. Thus, the sealing film 25 is formed to cover the organic EL element 18.

Figure 5:
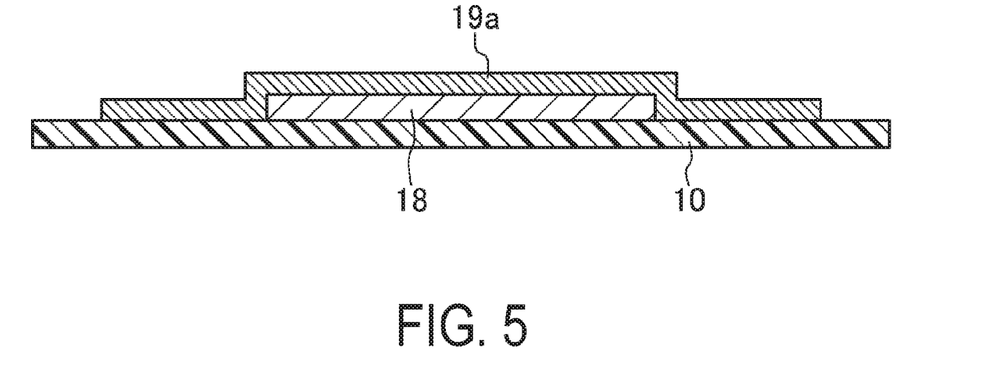
FIG. 5 is a cross-sectional view illustrating a method for producing the organic EL display device according to the first embodiment of the disclosure.

More specifically, first, silicon nitride is stacked over the surfaces of the base substrate 10 and the organic EL element 18 by, for example, a plasma CVD method, a sputtering method, or an atomic layer deposition method (ALD method). Thus, the silicon nitride layer 19a is formed to cover the surface of the organic EL element 18, as illustrated in FIG. 5.

Figure 6:
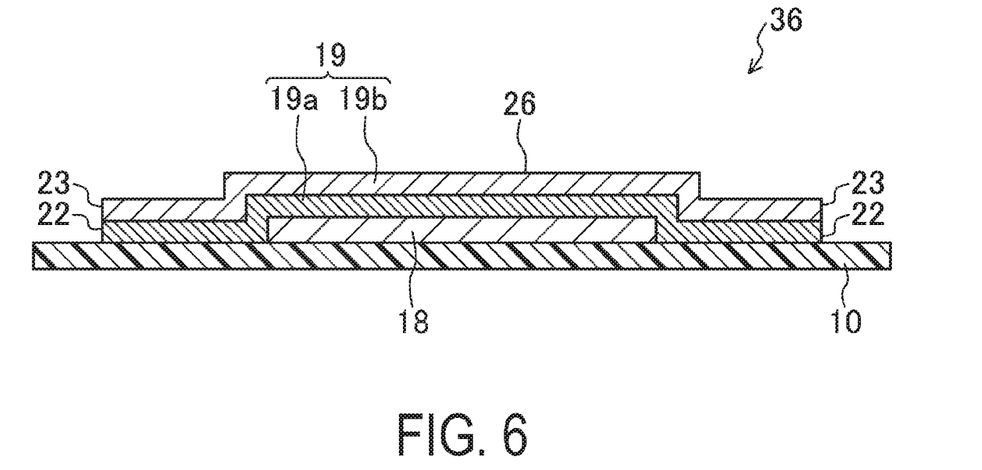
FIG. 6 is a cross-sectional view illustrating the method for producing the organic EL display device according to the first embodiment of the disclosure.

Next, as with the silicon nitride layer 19a described above, silicon oxynitride is stacked on the surface of the silicon nitride layer 19a by, for example, a plasma CVD method, a sputtering method, or an atomic layer deposition method (ALD method). Thus, the silicon oxynitride layer 19b is formed to cover the surface of the organic EL element 18, as illustrated in FIG. 6. In this manner, the first barrier layer 19, which includes the silicon nitride layer 19a and the silicon oxynitride layer 19b, is formed.

Next, a plasma treatment is performed on the surface 26 of the silicon oxynitride layer 19b by using an inert gas such as nitrogen gas. More specifically, the substrate to be treated, 36, illustrated in FIG. 6, is placed in a plasma apparatus, and inert gas is supplied to the surface 26 of the silicon oxynitride layer 19b. In this state, a high frequency voltage from a high frequency power supply is pulsed between the electrodes (anode electrode and cathode electrode) of the plasma apparatus, to generate a plasma. In this manner, the surface 26 of the silicon oxynitride layer 19b is plasma-treated.

Figure 7:
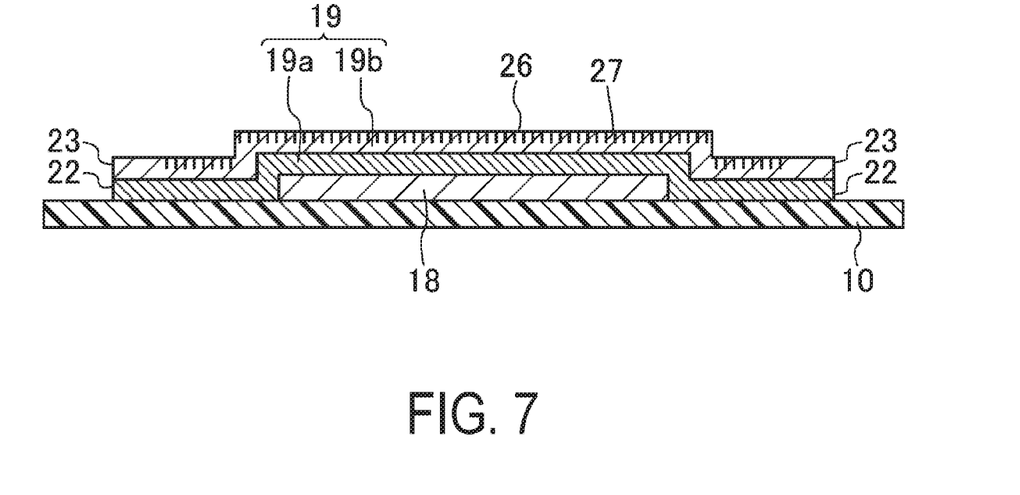
FIG. 7 is a cross-sectional view illustrating the method for producing the organic EL display device according to the first embodiment of the disclosure.

As a result, as illustrated in FIG. 7, the plurality of micropores 27 (e.g., from 20 to 150 nm in depth) are formed in the surface 26 of the silicon oxynitride layer 19b by the plasma treatment. Thus, microscopic irregularities (anchor pattern) are formed in the surface 26 of the silicon oxynitride layer 19b.

The micropores 27 may be formed over the entire area of the surface 26 of the silicon oxynitride layer 19b, or may be formed in one or more portions of the surface 26.

Examples of the inert gas include argon gas, helium gas, neon gas, krypton gas, and xenon gas. The flow rate of the inert gas may be set to 2500 sccm, for example. The "sccm" indicates the gas flow rate per minute per cubic centimeter at 0° C.

The generation of the plasma is in accordance with the voltage (potential difference) applied between the cathode electrode and the anode electrode. The power supply used to apply the voltage may be, for example, a microwave (frequency: 2.45 GHz) power supply or a high frequency (frequency: 13.56 MHz) power supply.

The output of the power supply is, for example, from 500 to 1000 W, but is appropriately adjusted in accordance with the frequency of the power supply and the size of the electrodes. The distance between the electrodes is, for example, from 2 to 4 cm. The duration of the plasma treatment may be set to 25 seconds, for example.

Figure 8:
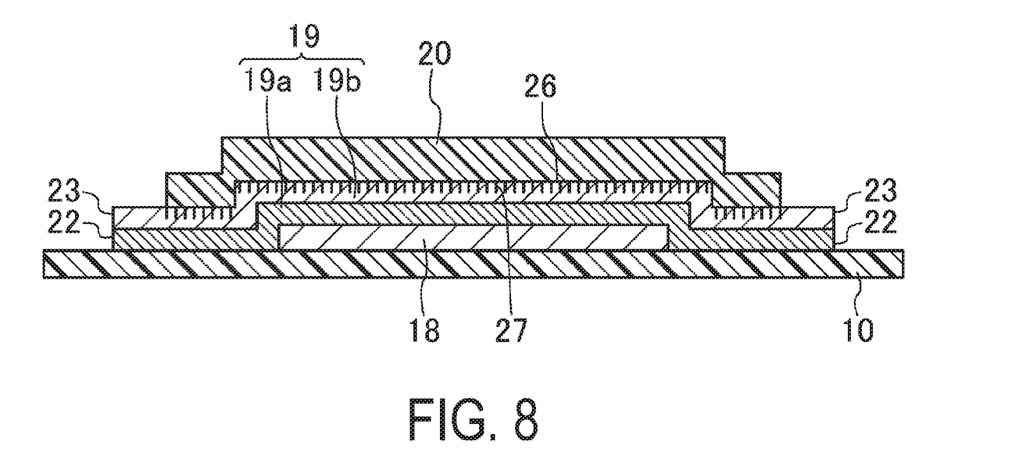
FIG. 8 is a cross-sectional view illustrating the method for producing the organic EL display device according to the first embodiment of the disclosure.

Next, an organic material is stacked on the surface 26 of the silicon oxynitride layer 19b by, for example, an ink-jet method or a vacuum vapor deposition method. Examples of the organic material include acrylate, polyurea, parylene, polyimide, and polyamide. Thus, the buffer layer 20 including the organic film is formed on the surface 26 of the silicon oxynitride layer 19b, as illustrated in FIG. 8.

Because the surface 26 of the silicon oxynitride layer 19b includes the irregularities (anchor pattern), the organic material that forms the buffer layer 20 flows into the plurality of micropores 27, which are formed in the surface 26 of the silicon oxynitride layer 19b, to produce an anchoring effect. As a result, the adhesion between the silicon oxynitride layer 19b and the buffer layer 20 is improved.

Subsequently, as with the first barrier layer 19 described above, silicon nitride is stacked on the surfaces of the first barrier layer 19 and the buffer layer 20 by, for example, a plasma CVD method, a sputtering method, or an atomic layer deposition method (ALD method). Thus, the silicon nitride layer 21a is formed to cover the surface of the buffer layer 20. Silicon oxynitride is also stacked on the surface of the silicon nitride layer 21a to form the silicon oxynitride layer 21b. Thus, the second barrier layer 21, which includes the silicon nitride layer 21a and the silicon oxynitride layer 21b, is formed, as illustrated in FIG. 2.

Thus, the sealing film 25, which includes the first barrier layer 19, the buffer layer 20, and the second barrier layer 21, is formed, and the organic EL display device 1 illustrated in FIGS. 1 and 2 is produced.

As illustrated in FIGS. 1 and 2, in the organic EL display device 1 of the present embodiment, the first barrier layer 19 and the second barrier layer 21 are larger than the buffer layer 20 in plan view, and cover an edge 20a of the buffer layer 20. In the width direction X of the organic EL display device 1, the first barrier layer 19 and the second barrier layer 21 are in contact with each other at a location outside the edge 20a of the buffer layer 20.

In the present embodiment, in the process of performing the plasma treatment described above on the second inorganic film, which is included in the second barrier layer 21, a portion of the interlayer insulating film at a terminal section is removed at the same time. The portion is located outside the first inorganic film.

Figure 9:
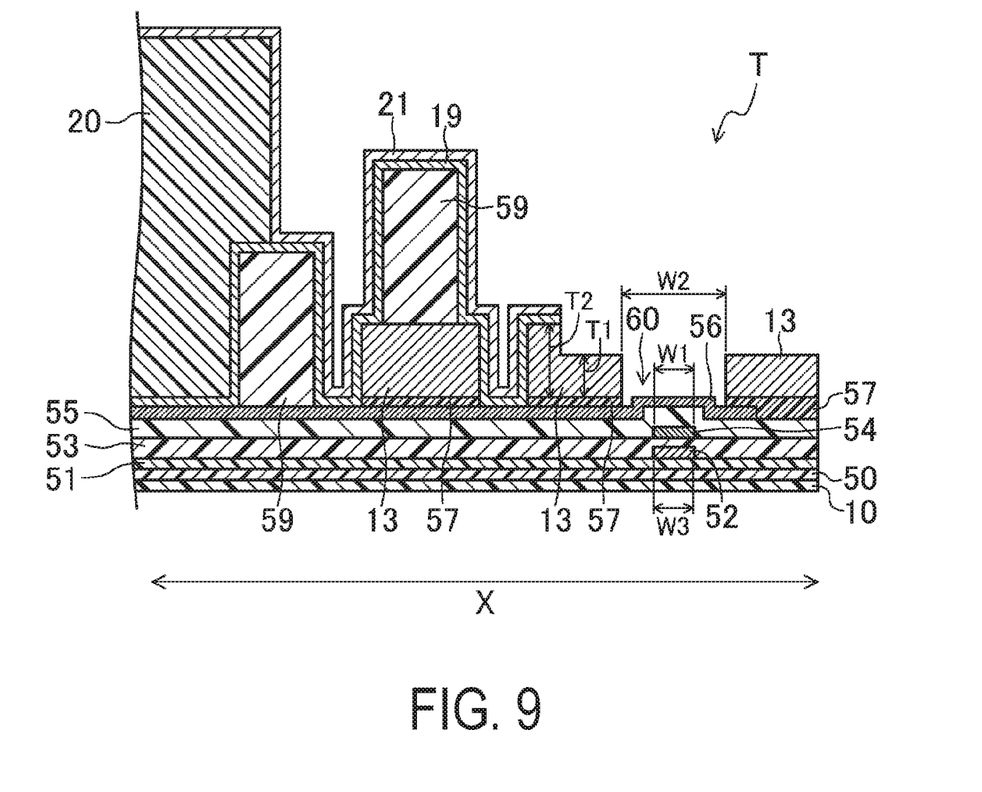
FIG. 9 is a cross-sectional view illustrating a terminal section of the organic EL display device according to the first embodiment of the disclosure.

FIG. 9 is a cross-sectional view illustrating the terminal section of the organic EL display device according to the present embodiment. The terminal section, T, includes a base coating layer 50, a gate insulator film 51, gate wiring lines 52, a first interlayer film (inorganic film) 53, capacitive wiring lines 54, a second interlayer film (inorganic film) 55, and a wiring layer 56. The base coating layer 50 is disposed over the base substrate 10. The gate insulator film 51 is disposed over the base coating layer 50. The gate wiring lines 52 are disposed over the gate insulator film 51. The first interlayer film 53 is disposed over the gate insulator film 51 and covers the gate wiring lines 52. The capacitive wiring lines 54 are disposed over the first interlayer film 53. The second interlayer film 55 is disposed over the first interlayer film 53. The wiring layer 56 is disposed over the second interlayer film 55. Further, the terminal section T includes a third interlayer film (inorganic film) 57, the interlayer insulating film 13, and an edge cover 59. The third interlayer film 57 is disposed over the wiring layer 56. The interlayer insulating film 13 is disposed over the third interlayer film 57. The edge cover 59 is disposed over the interlayer insulating film 13.

The third interlayer film 57 may not be provided. The interlayer insulating film 13 may be disposed directly on the wiring layer 56.

As illustrated in FIG. 9, the first barrier layer 19 and the second barrier layer 21 are disposed to cover portions of the interlayer insulating film 13 and the edge cover 59. As illustrated in FIG. 9, a contact hole 60 is formed in the interlayer insulating film 13, and the wiring layer 56 is exposed in the contact hole 60.

As described above, in the process of performing the plasma treatment on the second inorganic film, which is included in the second barrier layer 21, a portion of the interlayer insulating film 13 is removed at the same time. The portion is located outside the first barrier layer 19 in the width direction X of the organic EL display device. In other words, the portion of the interlayer insulating film 13 is on the contact hole 60 side.

As a result, as illustrated in FIG. 9, in the interlayer insulating film 13, a thickness T1, which is a thickness of portions not covered by the first barrier layer 19, is smaller than a thickness T2, which is a thickness of portions covered by the first barrier layer 19. Thus, the thickness of the portions of the interlayer insulating film 13 that define the contact hole 60 is small. As a result, when mounting a circuit board (not illustrated) to the wiring layer 56 via the contact hole, the contact between the wiring layer 56 and the circuit board can be easily made.

As illustrated in FIG. 9, at the contact hole 60, the capacitive wiring lines 54 are arranged in a pattern of islands below the wiring layer 56. In the width direction X of the organic EL display device 1, a width W1 of the capacitive wiring lines 54 is set to be smaller than a width W2 of the contact hole 60. Likewise, at the contact hole 60, the gate wiring lines 52 are arranged in a pattern of islands below the wiring layer 56. In the width direction X of the organic EL display device 1, a width W3 of the gate wiring lines 52 is set to be smaller than the width W2 of the contact hole 60.

Thus, as illustrated in FIG. 9, the position of the portion, of the wiring layer 56, that is exposed in the contact 60 is raised to be located at a higher position (the portion is, in other words, a connection terminal). As a result, when mounting a circuit board to the wiring layer 56, the contact between the wiring layer 56 and the circuit board can be made more easily.

The organic EL display device 1 of the present embodiment described above produces the following effects.

(1) The silicon oxynitride layer 19b includes the plurality of micropores (irregularities) 27 in the surface 26, and the buffer layer 20 is disposed on the surface 26. This configuration produces an anchoring effect to improve the adhesion between the first barrier layer 19 and the buffer layer 20. As a result, delamination of the buffer layer 20 can be prevented during the formation of the sealing film 25. Consequently, the organic EL display device 1, which has excellent sealing performance, is provided.

(2) The silicon oxynitride layer 19b is in contact with the buffer layer 20. The silicon oxynitride layer 19b includes oxygen molecules, which can easily bond with the organic film included in the buffer layer 20. Thus, the adhesion between the first barrier layer 19 and the buffer layer 20 is further improved.

Second Embodiment

Figure 10:
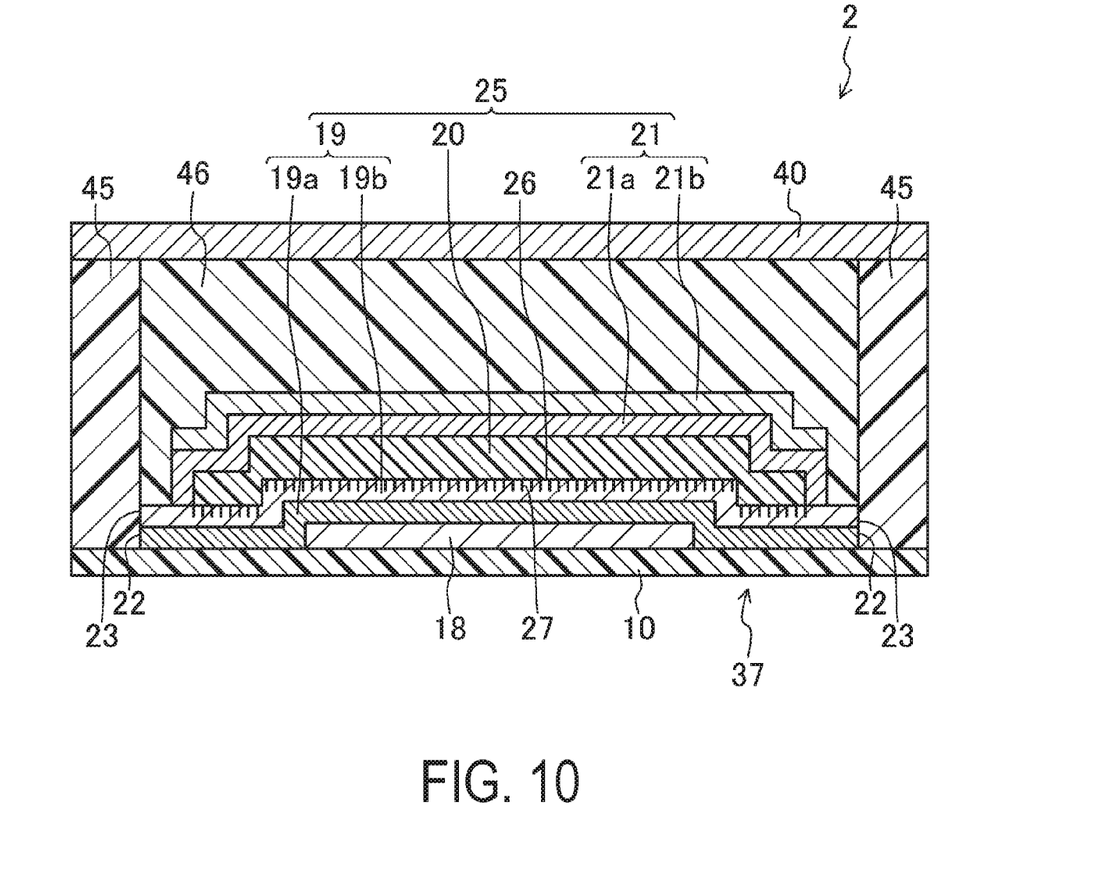
FIG. 10 is a cross-sectional view of an organic EL display device according to a second embodiment of the disclosure, schematically illustrating a configuration of the device.

FIG. 10 is a cross-sectional view of an organic EL display device according to the present embodiment, schematically illustrating a configuration of the device. In the following embodiments, parts identical to those in FIGS. 1 to 8 are designated by the same reference characters, and their detailed descriptions are omitted here.

In the first embodiment described above, the illustrated organic EL display device 1 does not include a sealing substrate. In the present embodiment, an organic EL display device 2, which includes a sealing substrate 40, is illustrated.

As illustrated in FIG. 10, the organic EL display device 2 includes an element substrate 37, a sealing substrate 40, a sealing member 45, and a sealing resin layer 46. The element substrate 37 and the sealing substrate 40 are disposed to face each other. The sealing member 45 has a frame shape and is disposed between the element substrate 37 and the sealing substrate 40. The sealing resin layer 46 is disposed in the region surrounded by the sealing member 45, between the element substrate 37 and the sealing substrate 40.

As illustrated in FIG. 10, the element substrate 37 has substantially the same configuration as the organic EL display device 1 of the first embodiment described above. In the present embodiment, the element substrate 37 having substantially the same configuration as the organic EL display device 1 of the first embodiment described above is illustrated. It is also possible that the element substrate 37 may be an organic EL display device 3 or 4, which will be described later.

The sealing substrate 40 includes, for example, a resin substrate and a base coating film disposed on the resin substrate. The resin substrate of the sealing substrate 40 has substantially the same configuration as the base substrate 10 of the first embodiment described above. The base coating film of the sealing substrate 40 has substantially the same configuration as the base coating film 11 of the first embodiment described above.

The sealing member 45 is disposed to bond the element substrate 37 and the sealing substrate 40 to each other at the perimeter portion of the substrates. Examples of materials that may be included in the sealing member 45 include UV-curable and/or thermosetting epoxy resins, acrylic resins, polyimide resins, and phenolic resins.

The sealing resin layer 46 functions as a getter that adsorbs, for example, moisture and oxygen. Examples of materials that may be included in the sealing resin layer 46 include thermosetting epoxy resins and silicone resins. Examples of other materials that may be included in the sealing resin layer 46 include metal oxides, such as calcium oxide (CaO), barium oxide (BaO), and aluminum oxide ($Al_2O_3$), activated carbon, silica gel, and zeolite.

The organic EL display device 2, configured as described above, is flexible. In each of the sub pixels, via the TFT 12, the light emitting layer 33 of the organic EL layer 16 is caused to emit light appropriately so that images can be displayed.

The organic EL display device 2, configured as described above, can be produced by the following process.

Using a dispenser method, for example, a sealing resin is placed on the surface of the organic EL display device 1, i.e., the element substrate 37 so that the sealing resin can have a frame shape. The organic EL display device 1 is one produced by the production method of the first embodiment described above. Also, a filling resin is dropped and placed inside the sealing resin.

Next, the element substrate 37, including the sealing resin and the filling resin placed thereon, and the sealing substrate 40 are bonded together in a reduced pressure atmosphere. Thereafter, by opening the reduced pressure atmosphere, a pressure is applied to the outer surfaces of the element substrate 37 and the sealing substrate 40.

Further, for example, the sealing resin, which is held between the element substrate 37 and the sealing substrate 40, is irradiated with UV light and thereafter the irradiated panel is heated to cure the sealing resin and the filling resin. Thus, the sealing member 45 and the sealing resin layer 46 are formed.

The organic EL display device 2 of the present embodiment described above produces the following effect (3), in addition to the above-described effects (1) and (2).

(3) The organic EL display device 2 includes the sealing substrate 40, the sealing member 45, and the sealing resin layer 46. The sealing substrate 40 is disposed to face the element substrate 37. The sealing member 45 is disposed between the element substrate 37 and the sealing substrate 40. The sealing resin layer 46 is disposed in the region surrounded by the sealing member 45, between the element substrate 37 and the sealing substrate 40. This configuration inhibits degradation of the organic EL element 18 and improves the reliability of the organic EL display device 2.

Other Embodiments

Figure 11:
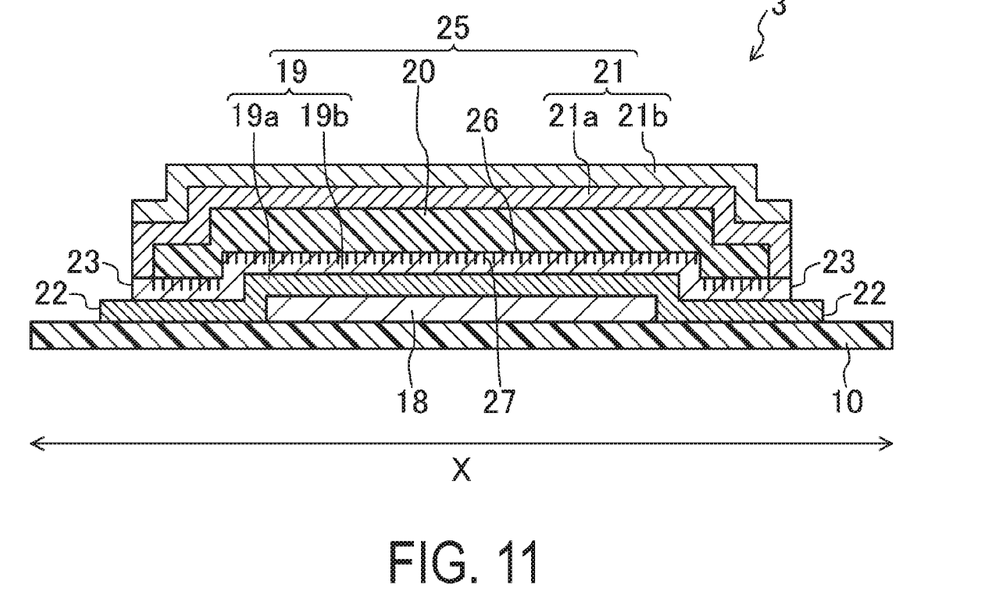
FIG. 11 is a cross-sectional view of a modified example of an organic EL display device according to the disclosure.

In the embodiments described above, the example of the first barrier layer 19 is given as follows. The first barrier layer 19 includes the stack of the silicon nitride layer 19a and the silicon oxynitride layer 19b, and the edge surfaces 22 of the silicon nitride layer 19a are flush with the edge surfaces 23 of the silicon oxynitride layer 19b, in the width direction X of the organic EL display device 1. As illustrated in FIG. 11, an organic EL display device 3 may have another configuration. In the organic EL display device 3, the edge surfaces 22 of the silicon nitride layer 19a may be located outside the edge surfaces 23 of the silicon oxynitride layer 19b in the width direction X.

In this case, the silicon nitride layer 19a, which has excellent barrier characteristics, are disposed so that the edge surfaces 22 thereof can be located on the outer side. This configuration further inhibits degradation of the organic EL element 18.

Figure 12:
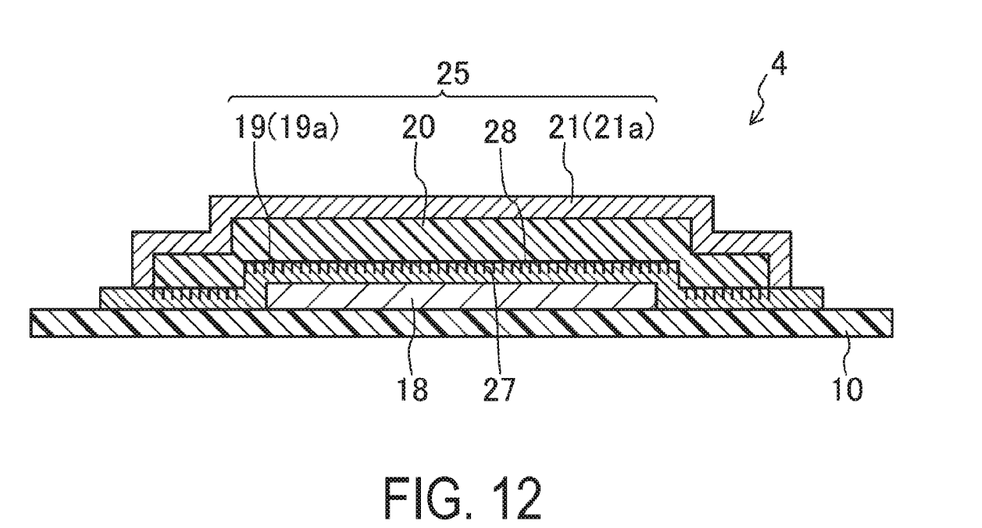
FIG. 12 is a cross-sectional view of a modified example of an organic EL display device according to the disclosure.

In the embodiments described above, the example of the first barrier layer 19 including the stack of the silicon nitride layer 19a and the silicon oxynitride layer 19b is given. However, as illustrated in FIG. 12, an organic EL display device 4 may have another configuration. In the organic EL display device 4, the first barrier layer 19 may include a single layer of the silicon nitride layer 19a, which has excellent barrier characteristics.

In this case, as illustrated in FIG. 12, the plurality of micropores 27 are formed in a surface 28 of the silicon nitride layer 19a, which is included in the first barrier layer 19. The surface 28 is in contact with the buffer layer 20.

As illustrated in FIG. 12, as with the first barrier layer, the second barrier layer 21 may include a single layer of the silicon nitride layer 21a.

In the embodiments described above, the example of the organic EL layer including the five-layer structure including the hole injecting layer, the hole transport layer, the light emitting layer, the electron transport layer, and the electron injecting layer is given. It is also possible that, for example, the organic EL layer may include a three-layer structure including a hole injection-cum-transport layer, a light emitting layer, and an electron transport-cum-injection layer.

In the embodiments described above, the example of the organic EL display devices including the first electrode as an anode and the second electrode as a cathode. However, the disclosure is also applicable to an organic EL display device, in which the layers of the structure of the organic EL layer are in the reverse order, with the first electrode being a cathode and the second electrode being an anode.

In the embodiments described above, the example of the organic EL display devices including the element substrate in which, the electrode of the TFT connected to the first electrode is the drain electrode. However, the disclosure is also applicable to an organic EL display device including an element substrate, in which the electrode of the TFT connected to the first electrode is referred to as the source electrode.

In the embodiments described above, organic EL display devices are described as display devices by way of example. The disclosure is applicable to display devices including a plurality of electro-optical elements that are driven by an electrical current. For example, the disclosure is applicable to display devices including Quantum-dot light emitting diodes (QLEDs), which are light emitting elements using a quantum dot-containing layer.

INDUSTRIAL APPLICABILITY

As described above, the disclosure is useful for organic EL display devices and methods for producing the same.

REFERENCE SIGNS LIST

1 Organic EL display device (display device)
2 Organic EL display device (display device)
3 Organic EL display device (display device)
4 Organic EL display device (display device)
10 Base substrate
13 Interlayer insulating film (insulating film)
18 Organic EL element (light emitting element)
19 First barrier layer
19a Silicon nitride layer
19b Silicon oxynitride layer
20 Buffer layer
20a Edge of buffer layer
21 Second barrier layer
21a Silicon nitride layer
21b Silicon oxynitride layer
22 Edge surface of silicon nitride layer
23 Edge surface of silicon oxynitride layer
25 Sealing film
26 Surface of silicon oxynitride layer
27 Micropores
37 Element substrate
40 Sealing substrate
45 Sealing member
46 Sealing resin layer
52 Gate wiring lines
54 Capacitive wiring line
56 Wiring layer
57 Third interlayer film (interlayer film)
60 Contact hole
T Terminal section

The invention claimed is:

1. A display device comprising:
a base substrate, the base substrate being flexible and including a display region and a non-display region each defined on the base substrate, the non-display region being disposed around the display region, the display device being configured to display images over the display region;
a light emitting element disposed over the display region of the base substrate; and
a sealing film disposed over the display region and the non-display region and covering the light emitting element, the sealing film including:
a first barrier layer including a first inorganic film;
a buffer layer including an organic film and disposed on a surface of the first barrier layer; and
a second barrier layer including a second inorganic film and disposed on a surface of the buffer layer,
wherein a plurality of micropores are formed in the surface of the first barrier layer, the surface being in contact with the buffer layer,
the first barrier layer includes a silicon nitride (SiN) layer disposed on a surface of the light emitting element and a silicon oxynitride (SiON) layer disposed on a surface of the silicon nitride layer and being in contact with the buffer layer, and the plurality of micropores are formed in a surface of the silicon oxynitride layer.

2. The display device according to claim 1, wherein an edge surface of the silicon nitride layer is located outside an edge surface of the silicon oxynitride layer in a width direction of the display device.

3. The display device according to claim 1,
wherein the first barrier layer and the second barrier layer are larger than the buffer layer in plan view, and cover an edge of the buffer layer, and
the first barrier layer and the second barrier layer are in contact with each other at a location outside the edge of the buffer layer in a width direction of the display device.

4. The display device according to of claim 1,
wherein the plurality of micropores have a depth ranging from 20 to 150 nm.

5. The display device according to of claim 1,
wherein the display device includes a terminal section including a wiring layer, an insulating film disposed over the wiring layer, and the first barrier layer disposed over the insulating film,
the insulating film includes a contact hole allowing a portion of the wiring layer to be exposed in the contact hole, and
the insulating film has a portion that is not covered by the first barrier layer and a portion covered by the first barrier layer, the portion that is not covered by the first barrier layer having a thickness smaller than a thickness of the portion covered by the first barrier layer.

6. The display device according to claim 5,
wherein, at the contact hole, capacitive wiring lines are arranged in a pattern of islands below the wiring layer, and
the capacitive wiring lines have a width smaller than a width of the contact hole in a width direction of the display device.

7. The display device according to claim 5,
wherein, at the contact hole, gate wiring lines are arranged in a pattern of islands below the wiring layer, and
the gate wiring lines have a width smaller than a width of the contact hole in a width direction of the display device.

8. The display device according to claim 1, further comprising:
a sealing substrate disposed to face the sealing film over the base substrate; and
a sealing member having a frame shape and disposed between an element substrate and the sealing substrate,
wherein the element substrate includes the base substrate, the light emitting element, and the sealing film, and
the sealing member bonds the element substrate and the sealing substrate to each other.

9. The display device according to claim 8,
wherein a sealing resin layer is disposed in a region surrounded by the sealing member, between the element substrate and the sealing substrate.

10. The display device according to claim 1,
wherein the light emitting element comprises an organic EL element.

11. A display device comprising:
a base substrate, the base substrate being flexible and including a display region and a non-display region each defined on the base substrate, the non-display region being disposed around the display region, the display device being configured to display images over the display region;

a light emitting element disposed over the display region of the base substrate; and a sealing film disposed over the display region and the non-display region and covering the light emitting element, the sealing film including:

a first barrier layer including a first inorganic film;

a buffer layer including an organic film and disposed on a surface of the first barrier layer; and a second barrier layer including a second inorganic film and disposed on a surface of the buffer layer, wherein a plurality of micropores are formed in the surface of the first barrier layer, the surface being in contact with the buffer layer, the display device includes a terminal section including a wiring layer, an insulating film disposed over the wiring layer, and a portion of the first barrier layer, the portion being disposed over the insulating film, the insulating film includes a contact hole allowing a portion of the wiring layer to be exposed in the contact hole, and the insulating film has a portion that is not covered by the first barrier layer and a portion covered by the first barrier layer, and the portion that is not covered by the first barrier layer has a thickness smaller than a thickness of the portion covered by the first barrier layer.

12. The display device according to claim 11, wherein the first barrier layer includes a silicon nitride (SiN) layer.

13. The display device according to claim 11, wherein the first barrier layer and the second barrier layer are larger than the buffer layer in plan view, and cover an edge of the buffer layer, and the first barrier layer and the second barrier layer are in contact with each other at a location outside the edge of the buffer layer in a width direction of the display device.

14. The display device according to claim 11, wherein the plurality of micropores have a depth ranging from 20 to 150 nm.

15. The display device according to claim 11, wherein, at the contact hole, capacitive wiring lines are arranged in a pattern of islands below the wiring layer, and the capacitive wiring lines have a width smaller than a width of the contact hole in a width direction of the display device.

16. The display device according to claim 11, wherein, at the contact hole, gate wiring lines are arranged in a pattern of islands below the wiring layer, and the gate wiring lines have a width smaller than a width of the contact hole in a width direction of the display device.

17. The display device according to claim 11, further comprising:

a sealing substrate disposed to face the sealing film over the base substrate; and a sealing member having a frame shape and disposed between an element substrate and the sealing substrate, wherein the element substrate includes the base substrate, the light emitting element, and the sealing film, and the sealing member bonds the element substrate and the sealing substrate to each other.

18. The display device according to claim 17, wherein a sealing resin layer is disposed in a region surrounded by the sealing member, between the element substrate and the sealing substrate.

19. The display device according to claim 11, wherein the light emitting element comprises an organic EL element.

* * * * *